(12) United States Patent  
Ramadorai et al.

(10) Patent No.: US 7,533,316 B2  
(45) Date of Patent: May 12, 2009

(54) METHOD AND APPARATUS FOR DISABLING AND SWAPPING CORES IN A MULTI-CORE MICROPROCESSOR

(75) Inventors: Ray Ramadorai, Beaverton, OR (US); Derek Feltham, Portland, OR (US); Jonathan Douglas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 405 days.

(21) Appl. No.: 11/394,737

(22) Filed: Mar. 31, 2006

(65) Prior Publication Data

US 2007/0255985 A1 Nov. 1, 2007

(51) Int. Cl.  
*G01R 31/28* (2006.01)

(52) U.S. Cl. .......................... 714/733; 714/30

(58) Field of Classification Search .......... 714/28, 714/37, 43, 727, 733, 30; 713/68, 100  
See application file for complete search history.

(56) References Cited

U.S. PATENT DOCUMENTS

| | | | |
|---|---|---|---|
| 5,954,824 A * | 9/1999 | Cherichetti et al. ........... 714/28 |
| 6,055,656 A | 4/2000 | Wilson, Jr. et al. |
| 6,134,675 A * | 10/2000 | Raina .......................... 714/37 |
| 6,907,548 B2 * | 6/2005 | Abdo .......................... 714/43 |
| 7,228,440 B1 * | 6/2007 | Giles et al. .................. 713/168 |
| 2003/0126515 A1 * | 7/2003 | Abdo .......................... 714/43 |
| 2003/0131296 A1 * | 7/2003 | Park et al. .................... 714/727 |
| 2006/0004942 A1 * | 1/2006 | Hetherington et al. ......... 711/3 |
| 2007/0022342 A1 * | 1/2007 | Picano et al. ................ 714/727 |
| 2007/0226482 A1 * | 9/2007 | Borkar et al. ................ 713/100 |

OTHER PUBLICATIONS

U.S. Appl. No. 11/135,158, filed May 23, 2005, Shahidzadeh, et al.

* cited by examiner

*Primary Examiner*—David Ton  
(74) *Attorney, Agent, or Firm*—David L. Guglielmi

(57) ABSTRACT

In some embodiments, a method and apparatus for disabling and swapping cores in a multi-core microprocessor are presented. In this regard, a test agent is introduced to disable a core, to configure a mode, and to configure a site. Other embodiments are also disclosed and claimed.

9 Claims, 3 Drawing Sheets

US 7,533,316 B2

METHOD AND APPARATUS FOR DISABLING AND SWAPPING CORES IN A MULTI-CORE MICROPROCESSOR

FIELD OF THE INVENTION

Embodiments of the present invention generally relate to the field of testing microprocessors, and, more particularly to a method and apparatus for disabling and swapping cores in a multi-core microprocessor.

BACKGROUND OF THE INVENTION

With the introduction of microprocessors with multiple computing cores (multi-core), manufacturers are presented with a challenge of being able to fully test every core in a multi-core microprocessor. Existing test programs that were designed for a single-core microprocessor may not work when there are multiple cores connected to the same bus. Developing completely new test programs requires much time and resources.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
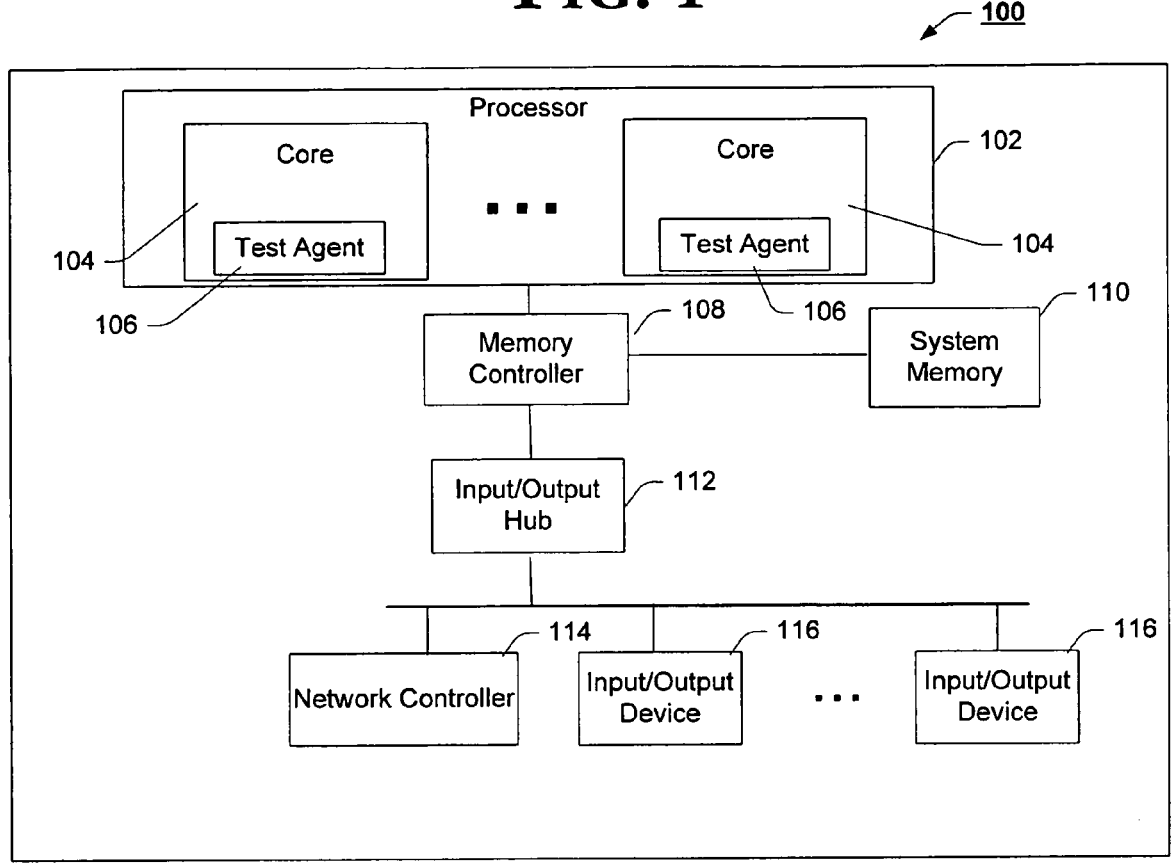
FIG. 1 is a block diagram of an example electronic appliance suitable for implementing a test agent, in accordance with one example embodiment of the invention.

FIG. 1 is a block diagram of an example electronic appliance suitable for implementing a test agent, in accordance with one example embodiment of the invention. Electronic appliance 100 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In one embodiment, electronic appliance 100 represents a manufacturing test platform to test microprocessors. In accordance with the illustrated example embodiment, electronic appliance 100 may include one or more of processor 102, cores 104, test agents 106, memory controller 108, system memory 110, input/output hub 112, network controller 114, and input/output device(s) 116 coupled as shown in FIG. 1. Test agent 106, as described more fully hereinafter, may well be used in electronic appliances of greater or lesser complexity than that depicted in FIG. 1.

Processor 102 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors 102 is and Intel® compatible processor. Processor 102 may have an instruction set containing a plurality of machine level instructions that may be invoked, for example by an application or operating system. Processor 102 includes multiple cores 104 and circuitry (not shown) coupling the cores 104 to a common bus. In one embodiment processor 102 contains two cores 104, though the present invention is not limited in this respect.

Each core 104 contains a test agent 106. Test agent 106 may have an architecture as described in greater detail with reference to FIG. 2. Test agent 106 may also perform one or more methods to handle memory operations, such as the method described in greater detail with reference to FIG. 5.

Memory controller 108 may represent any type of chipset or control logic that interfaces system memory 110 with the other components of electronic appliance 100. In one embodiment, the connection between processor 102 and memory controller 108 may be referred to as a front-side bus. In another embodiment, memory controller 108 may be referred to as a north bridge System memory 110 may represent any type of memory device(s) used to store data and instructions that may have been or will be used by processor(s) 102. Typically, though the invention is not limited in this respect, system memory 110 will consist of dynamic random access memory (DRAM). In one embodiment, system memory 110 may consist of Rambus DRAM (RDRAM). In another embodiment, system memory 110 may consist of double data rate synchronous DRAM (DDRSDRAM).

Input/output (I/O) controller 112 may represent any type of chipset or control logic that interfaces I/O device(s) 116 with the other components of electronic appliance 100. In one embodiment, I/O controller 112 may be referred to as a south bridge. In another embodiment, I/O controller 112 may comply with the Peripheral Component Interconnect (PCI) Express™ Base Specification, Revision 1.0a, PCI Special Interest Group, released Apr. 15, 2003.

Network controller 114 may represent any type of device that allows electronic appliance 100 to communicate with other electronic appliances or devices. In one embodiment, network controller 114 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 114 may be an Ethernet network interface card.

Input/output (I/O) device(s) 116 may represent any type of device, peripheral or component that provides input to or processes output from electronic appliance 100.

Figure 2:
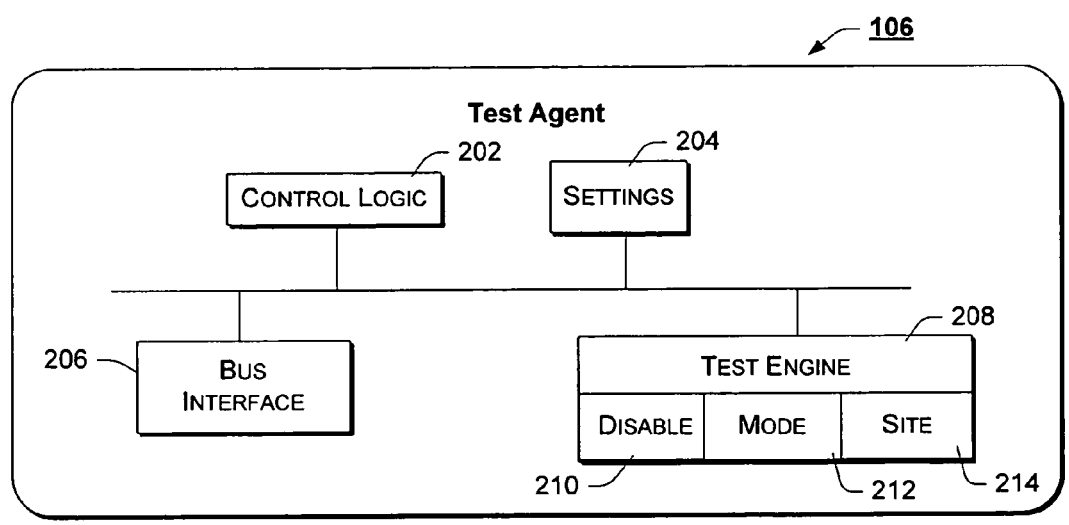
FIG. 2 is a block diagram of an example test agent, in accordance with one example embodiment of the invention.

FIG. 2 is a block diagram of an example test agent, in accordance with one example embodiment of the invention. As shown, test agent 106 may include one or more of control logic 202, settings 204, bus interface 206, and test engine 208 coupled as shown in FIG. 2. In accordance with one aspect of the present invention, to be developed more fully below, test agent 106 may include a test engine 208 comprising disable services 210, mode services 212 and site services 214. It is to be appreciated that, although depicted as a number of disparate functional blocks, one or more of elements 202-212 may well be combined into one or more multi-functional blocks. Similarly, test engine 208 may well be practiced with more or fewer functional blocks, i.e., with only disable services 210, without deviating from the spirit and scope of the present invention. In this regard, test agent 106 in general and test engine 208 in particular are merely illustrative of one example implementation of one aspect of the present invention. As used herein, test agent 106 may well be embodied in hardware, software, firmware and/or any combination thereof.

Test agent 106 may have the ability to disable a core, to configure a mode, and to configure a site. In one embodiment, test agent 106 may represent test programs that interact with hardware within each core 104. It will occur to one skilled in the art that the present invention can be utilized to reuse existing test programs designed for single-core use. In this way, while some new multi-core tests would be required, much time and effort can be saved when introducing a new multi-core microprocessor.

As used herein control logic 202 provides the logical interface between test agent 106 and its host electronic appliance 100. In this regard, control logic 202 may manage one or more aspects of test agent 106 to provide a communication interface from electronic appliance 100 to software, firmware and the like, e.g., instructions being executed by processor 102. In one embodiment, control logic 202 represents test software running on a test platform. In another embodiment, control logic 202 represent a Joint Test Action Group (JTAG) controller.

According to one aspect of the present invention, though the claims are not so limited, control logic 202 may receive event indications such as, e.g., a new test is to be initiated. Upon receiving such an indication, control logic 202 may selectively invoke the resource(s) of test engine 208. As part of an example method for disabling and swapping cores in a multi-core microprocessor, as explained in greater detail with reference to FIG. 5, control logic 202 may selectively invoke disable services 210 that may disable (or enable) a core. Control logic 202 also may selectively invoke mode services 212 and site services 214, as explained in greater detail with reference to FIG. 5, to configure processor 102 for a number of active cores and to configure the logical sequence of active cores, respectfully.

Settings 204 is intended to represent any of a wide variety of memory devices and/or systems known in the art that can store memory interface settings. According to one example implementation, though the claims are not so limited, settings 204 represents programmable read only memory (PROM) within each core. Settings 204 may store a status which indicates whether a core is active, the number of active cores, and the logical location of the core. In one embodiment, the status of each core is stored in two locations: a PROM programmable through a system bus, and registers programmable through a TAP. In this way, control of the core status may be changed from multiple locations. For example, in a test environment a TAP interface may be used to change the status of a core, while in a manufacturing environment programming of the PROM may used to change the status of a core.

Bus interface 206 provides a path through which test agent 106 can communicate with electronic appliance 100. Test agent 106 utilizes this interface to respond to status changes. In one embodiment, bus interface 206 represents a serial test access port that complies with the Institute of Electrical and Electronics Engineers (IEEE) 1149.1-2001 specification (approved Jun. 14, 2001, revision of IEEE 1149.1-1990).

Disable services 210, as introduced above, may provide test agent 106 with the ability to disable and enable a core. Disable services 210 may encompass a single bit within each core 104 to determine if it is enabled or disabled. In one embodiment, disable services 210 disable the core clocks and tri-state core outputs if the core is disabled. In this way, a disabled core would not be logically present in processor 102.

Mode services 212, as introduced above, may provide test agent 106 with the ability to configure processor 102 for a number of active cores. Mode services 212 may encompass one or more bits depending on the number of cores 104 in processor 102. For example, if processor 102 contains four cores, mode services 212 may encompass two bits, and if processor 102 contains two cores, mode services 212 may encompass one bit, and so on. In one embodiment, mode services 212 works in conjunction with site services 214 to enable on-die termination for a terminating core.

Site services 214, as introduced above, may provide test agent 106 with the ability to configure the logical sequence of cores. While cores 104 can not be rearranged physically, site services 214 may allow the cores 104 to be rearranged logically. In one embodiment, site services 214 maintains the logical location within each core 104 and in conjunction with mode services 212 will enable on-die termination for a terminating core.

Figure 3:
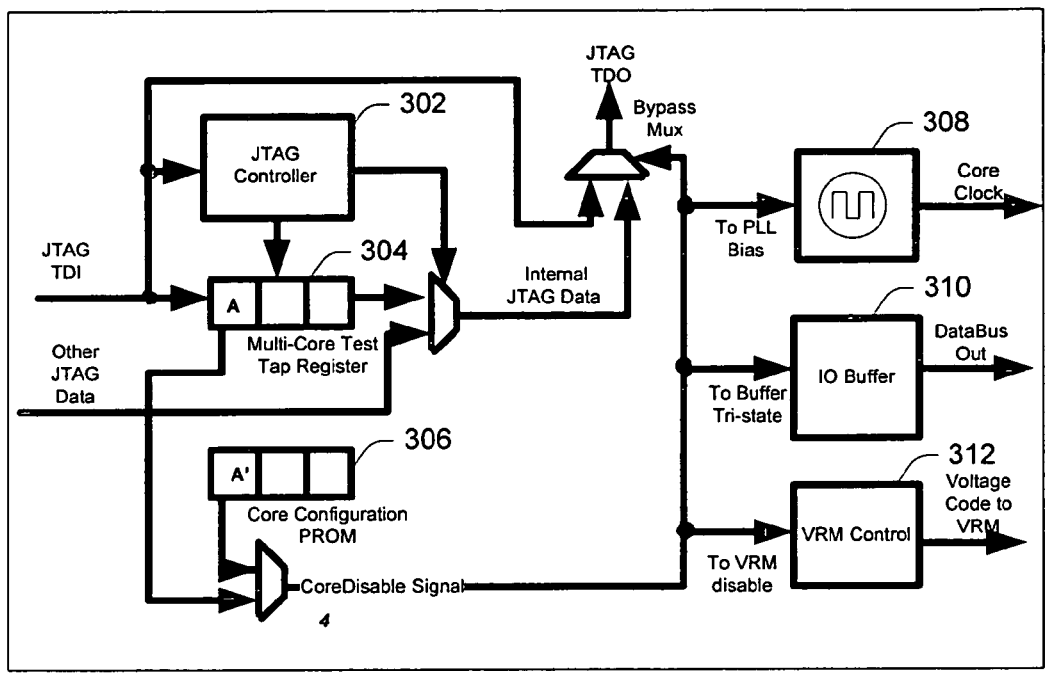
FIG. 3 is a circuit diagram of an example test agent, in accordance with one example embodiment of the invention.

FIG. 3 is a circuit diagram of an example test agent, in accordance with one example embodiment of the invention. As shown, test agent 106 may include one or more of JTAG controller 302, TAP register 304, core PROM 306, core clocks 308, I/O buffer 310, and voltage regulator module (VRM) control 312 coupled as shown in FIG. 3.

FIG. 3. represents an embodiment of circuitry to implement disable services 210. While only a disable setting ("A") is shown, mode and site settings may simultaneously be programmed. In this embodiment the test data in (TDI) line is used to program TAP register 304 that is able to, along with corresponding core PROM 306, enable or disable the core. When an indication to disable the core is received by JTAG controller 302, the appropriate bit is changed and this will affect additional circuitry. Core clocks 308 would be turned off, I/O buffers 310 would be tri-stated and VRM control 312 of the core would be disabled, or alternatively could be set to power down the core. JTAG controller 302 may also be disabled except for the ability to enable the core.

Figure 4:
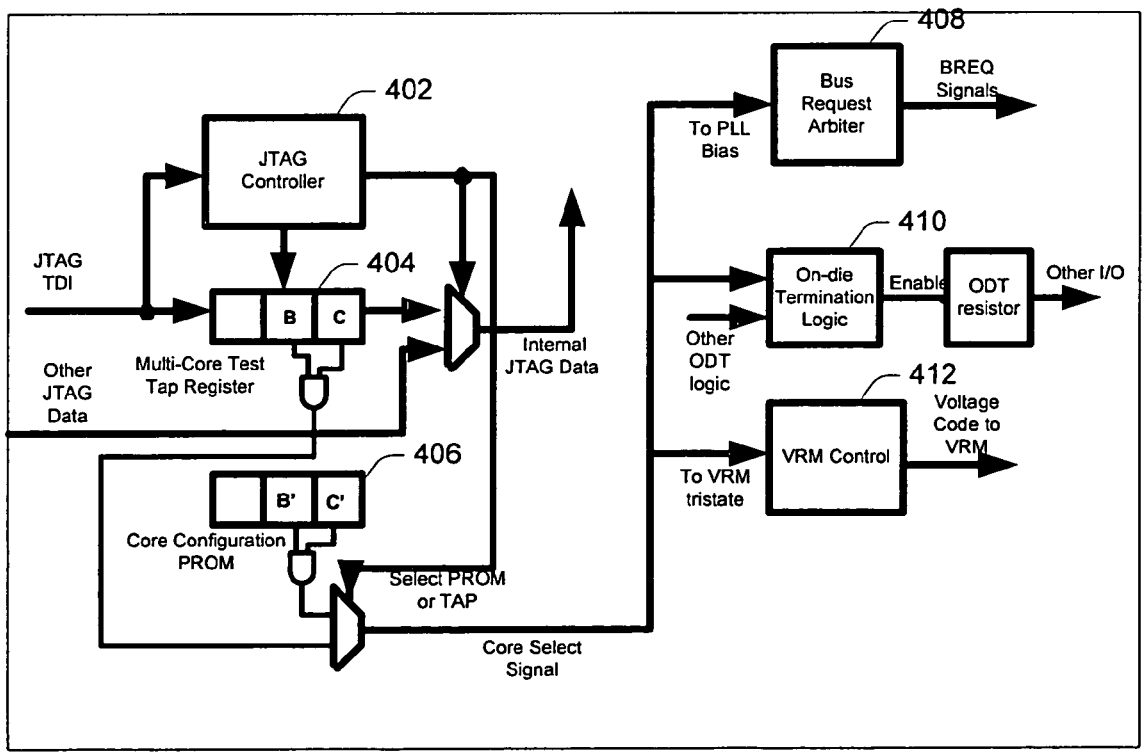
FIG. 4 is a circuit diagram of an example test agent, in accordance with one example embodiment of the invention.

FIG. 4 is a circuit diagram of an example test agent, in accordance with one example embodiment of the invention. As shown, test agent 106 may include one or more of JTAG controller 402, TAP register 404, core PROM 406, bus request arbiter 408, on-die termination logic 410, and voltage regulator module (VRM) control 412 coupled as shown in FIG. 4.

FIG. 4 represents an embodiment of circuitry to implement mode services 212 and site services 214. While mode and site settings ("B" and "C") are shown, a disable setting may simultaneously be programmed. In this embodiment the test data in (TDI) line is used to program TAP register 404 that is able to, along with corresponding core PROM 406, change the mode and logical location of the core. When an indication to change mode and logical location of the core is received by JTAG controller 402, the appropriate bits are changed and this will affect additional circuitry. Bus request arbiter 408 would be configured to comply with the arbitration protocol for the particular site (logical location) of the core. If the mode indicates there are multiple cores active, and the site indicates the core is the terminating core, then on-die termination logic 410 would be enabled to terminate the bus. VRM control 412 would be enabled if core is the only active core or a primary core in a multi-core configuration. Other core specific functions could be implemented using additional circuitry not shown.

Figure 5:
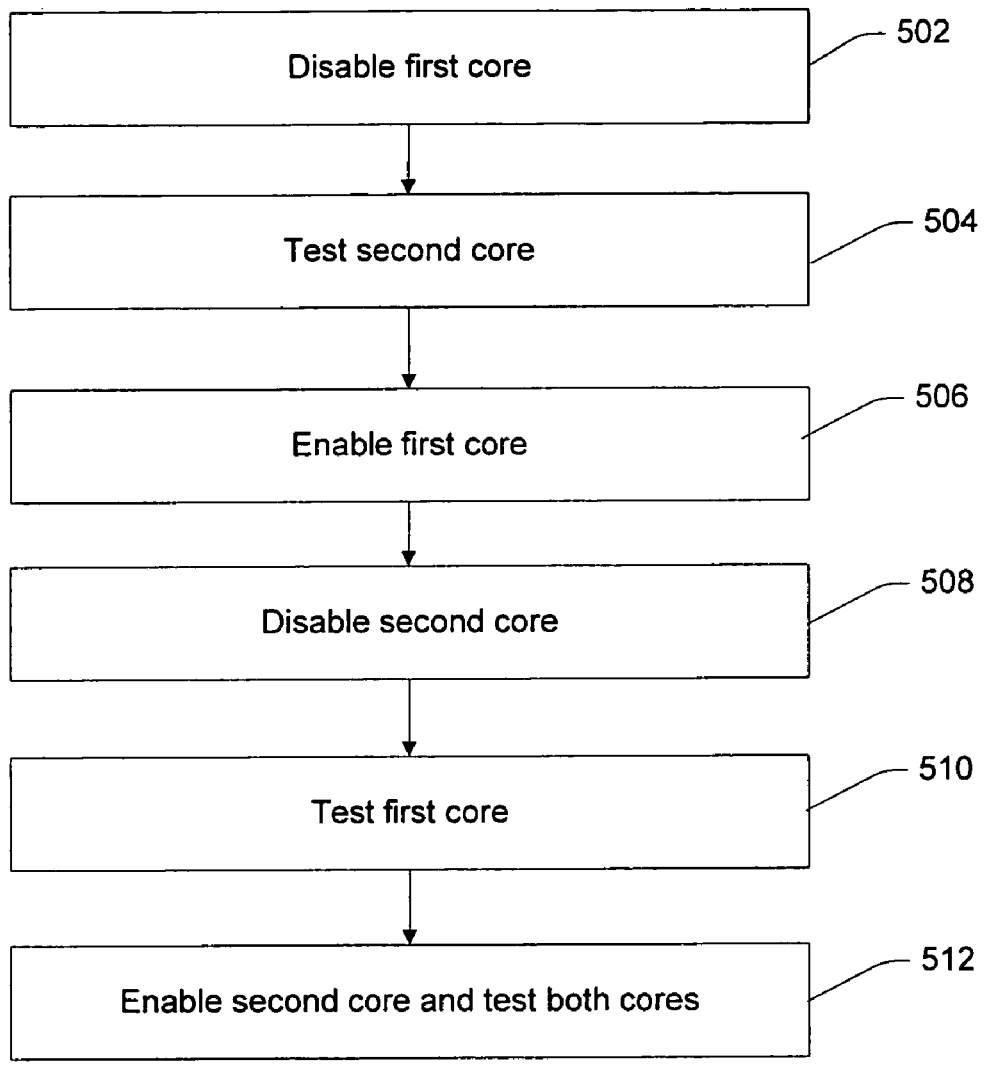
FIG. 5 is a flow chart of an example method for disabling and swapping cores in a multi-core microprocessor, in accordance with one example embodiment of the invention.

FIG. 5 is a flow chart of an example method for disabling and swapping cores in a multi-core microprocessor, in accordance with one example embodiment of the invention. It will be readily apparent to those of ordinary skill in the art that although the following operations may be described as a sequential process, many of the operations may in fact be performed in parallel or concurrently. In addition, the order of the operations may be re-arranged without departing from the spirit of embodiments of the invention.

According to but one example implementation, the method of FIG. 5 begins with a first core 104 being disabled (502). Disable services 210 may be invoked and the circuitry of FIG. 3 may disable the first core 104. Test agent 106 of a second core 104 may configure the second core to function in a single-core mode and the method would continue with testing (504) the second core.

The first core may then be enabled (506) and configured to function in single-core mode by test agent 106. Second core 104 may then be disabled (508) and the first core 104 would be tested (510) with programs designed to test a single-core microprocessor.

Lastly, both cores may be configured by test agent 106 to function in a dual-core mode (with one core acting as the primary core and the other acting as the terminating core) and tested (512) with programs designed to operate on a dual-core microprocessor.

Figure 6:
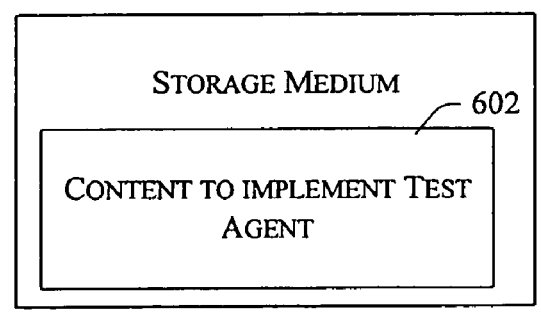
FIG. 6 is a block diagram of an example article of manufacture including content which, when accessed by a device, causes the device to implement one or more aspects of one or more embodiment(s) of the invention.

FIG. 6 illustrates a block diagram of an example storage medium comprising content which, when accessed, causes an electronic appliance to implement one or more aspects of the test agent 106 and/or associated method 500. In this regard, storage medium 600 includes content 602 (e.g., instructions, data, or any combination thereof) which, when executed, causes the appliance to implement one or more aspects of test agent 106, described above.

The machine-readable (storage) medium 600 may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem, radio or network connection).

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Embodiments of the present invention may be used in a variety of applications. Although the present invention is not limited in this respect, the invention disclosed herein may be used in microcontrollers, general-purpose microprocessors, Digital Signal Processors (DSPs), Reduced Instruction-Set Computing (RISC), Complex Instruction-Set Computing (CISC), disk drives, computers, among other electronic components. However, it should be understood that the scope of the present invention is not limited to these examples.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An electronic appliance, comprising:
   a memory to store data;
   a network controller to communicate data; and
   a multi-core processor to process data coupled with the network controller and the memory, wherein the processor includes circuitry to disable one or more cores and function with the remaining core(s).

2. The electronic appliance of claim 1, further comprising programmable read only memory (PROM) within the cores to store the status of the core.

3. The electronic appliance of claim 2, further comprising a test access port (TAP) to program the PROM.

4. The electronic appliance of claim 1, wherein the processor comprises two cores.

5. A processor comprising:
   a test access port (TAP); and
   a plurality of cores, wherein each core includes a test agent, wherein the test agent to disable the core, to configure a mode, and to configure a site.

6. The processor of claim 5, wherein the test agent to disable the core comprises the test agent to disable the core clocks and to tri-state outputs in response to a request received through the TAP.

7. The processor of claim 5, wherein the test agent to configure a mode comprises the test agent to drive on-die termination depending on the number of active cores in response to a request received through the TAP.

8. The processor of claim 5, wherein the test agent to configure a site comprises the test agent to reorder bus request logic depending on the logical location of a core in response to a request received through the TAP.

9. The processor of claim 5, wherein the TAP complies with the Institute of Electrical and Electronics Engineers (IEEE) 1149.1-2001 specification.

* * * * *